United States Patent
Yeh et al.

(10) Patent No.: US 10,306,768 B2
(45) Date of Patent: May 28, 2019

(54) METHOD FOR MANUFACTURING TRACES OF PCB

(71) Applicants: TRIALLIAN CORPORATION, New Taipei (TW); Albert Yeh, New Taipei (TW)

(72) Inventors: Albert Yeh, New Taipei (TW); Nick Yang, New Taipei (TW)

(73) Assignees: TRIALLIAN CORPORATION, New Taipei (TW); Albert Yeh, New Taipei (TW)

( * ) Notice: Subject to any disclaimer, the term of this patent is extended or adjusted under 35 U.S.C. 154(b) by 0 days.

(21) Appl. No.: 15/876,140

(22) Filed: Jan. 20, 2018

(65) Prior Publication Data
US 2018/0310414 A1   Oct. 25, 2018

(30) Foreign Application Priority Data
Apr. 21, 2017   (TW) .............................. 106113528 A

(51) Int. Cl.
*H05K 3/06* (2006.01)
*H05K 3/42* (2006.01)
(Continued)

(52) U.S. Cl.
CPC .............. *H05K 3/06* (2013.01); *H05K 1/115* (2013.01); *H05K 3/0038* (2013.01); *H05K 3/064* (2013.01); *H05K 3/424* (2013.01); *H05K 3/425* (2013.01); *H01L 21/486* (2013.01); *H01L 23/49827* (2013.01); *H01L 23/49838* (2013.01); *H01L 23/49866* (2013.01); *H05K 1/09* (2013.01); *H05K 3/0026* (2013.01); *H05K 3/26* (2013.01); *H05K 3/4084* (2013.01); *H05K 2201/0323* (2013.01); *H05K 2201/09509* (2013.01);
(Continued)

(58) Field of Classification Search
CPC ............ H05K 3/06; H05K 3/424; H05K 3/26; H05K 3/0026; H05K 1/115; H05K 1/09; H01L 21/486; Y10T 29/49165; Y10T 29/49155; Y10T 29/49124; Y10T 29/49117; Y10T 29/49002
USPC ............... 29/852, 846, 832, 829, 825, 592.1
See application file for complete search history.

(56) References Cited

U.S. PATENT DOCUMENTS

| | | | |
|---|---|---|---|
| 9,105,696 B1 * | 8/2015 | Dow | H01L 21/02057 |
| 2007/0145584 A1 * | 6/2007 | Kataoka | C25D 5/02 257/736 |

FOREIGN PATENT DOCUMENTS

CN    105198491 A    12/2015

* cited by examiner

*Primary Examiner* — Peter Dungba Vo
*Assistant Examiner* — Azm A Parvez
(74) *Attorney, Agent, or Firm* — Pai Patent & Trademark Law Firm; Chao-Chang David Pai

(57) ABSTRACT

A method for manufacturing traces of a printed circuit board (PCB) comprises an application of the periodic pulse reverse (PPR) pattern plating process. In the first stage, walls and bottoms in drilled holes of the PCB are modified with reduced graphene oxide (rGO) so that the vias can be formed by filling with copper and a very thin copper layer can be formed on the substrate through the electroplating process. In the second stage, a pattern of very fine traces with width/space less than 30/30 μm is formed on the thin copper layer and then the traces are formed through the PPR pattern plating process. After removing unwanted copper layer, the traces with even thicknesses and square profiles are achieved and thus conform to requirements of the high density interconnection (HDI) technology.

3 Claims, 4 Drawing Sheets

(51) Int. Cl.
  *H05K 1/11*     (2006.01)
  *H05K 3/00*     (2006.01)
  *H05K 1/09*         (2006.01)
  *H05K 3/26*         (2006.01)
  *H01L 21/48*        (2006.01)
  *H01L 23/498*       (2006.01)
  *H05K 3/40*         (2006.01)

(52) U.S. Cl.
  CPC .............. *H05K 2201/09563* (2013.01); *H05K 2203/0392* (2013.01); *H05K 2203/0723* (2013.01); *H05K 2203/0759* (2013.01); *H05K 2203/107* (2013.01); *H05K 2203/122* (2013.01); *Y10T 29/49165* (2015.01)

METHOD FOR MANUFACTURING TRACES OF PCB

BACKGROUND OF THE INVENTION

1. Field of the Invention

The present invention relates to a method for manufacturing traces of a printed circuit board (PCB), and particularly to a method for modifying walls and bottoms of the holes with reduced graphene oxide (rGO) and applying the periodic pulse reverse (PPR) pattern plating process. The substrate-like PCB layout for high-density interconnection (HDI) can thereby be enhanced.

2. Description of Related Art

The PCB design is developed generally with the integrated circuit (IC) chips. When the IC is designed in a scale of micrometer (μm), the trace width/space of the PCB is designed in a scale of millimeter (mm). Nowadays, the PCB is designed in mm scale with the IC in nanometer (nm) scale and therefore the HDI technology is widely used in manufacturing the PCB.

Traditionally, the IC chip with much smaller conductor width/space than the PCB is previously packaged on a substrate such as a flip chip (FC) substrate, and then attached to the PCB. The conductors on the substrate thus electrically connect to those on the PCB. However, for tiny electric product, it's a trend to package the IC chips directly on the substrate-like PCB with very fine traces thereon.

A conventional process to construct very fine traces is the modified semi-additive process (MSAP), which includes steps of depositing copper on via walls and a surface of a copper cladding substrate with drilled vias through the electroless plating process, then simultaneously filling the vias and thickening the traces by the pattern electroplating process with an anti-plating film, removing the anti-plating film and finally etching away the copper where no trace is formed.

For the MSAP, there are still some aspects that should be improved when manufacturing traces with width/space below 30/30 μm as shown in FIG. 1. For example,
1. the deposited copper layer is thick and uneven;
2. undercut occurs when etching unwanted copper;
3. thicknesses of the thickened traces are uneven; and
4. profiles of the traces are not square.

SUMMARY OF THE INVENTION

An object of the present invention is to provide a method for manufacturing very fine traces of a PCB without overly modifying the process and expensive equipment or materials. The very fine traces possess very small interval spaces and superior shapes.

The method of the present invention includes steps of:
A. providing a substrate with a copper cladding layer and drilled vias and modifying via walls with reduced graphene oxide (rGO);
B. superfilling the vias with copper and forming a thin flat copper layer with a thickness of 1-20 μm at a variation less than 10% through an electroplating process;
C. forming a patterned anti-plating film on the thin flat copper layer to define an area of traces having widths of 3-50 μm and interval spaces of 3-50 μm;
D. depositing copper on the area of traces with thicknesses of 5-50 μm at a variation of less than 15% through a periodic pulse reverse (PPR) plating process;
E. removing the anti-plating film; and
F. etching the thin flat copper layer and the copper cladding layer without copper deposited thereon.

The PPR plating process is preferably operated at a forward current density of 0.5-5 ASD (amps per square decimeter), a forward/reverse current density ratio of 1:1-1:10 (more preferably 1:1-1:5) and a forward/reverse time ratio of 2:1-50:1 (more preferably 10:1-25:1).

According to the aforementioned method, a printed circuit board comprising a nonconductive substrate with drilled holes, vias formed in the drilled holes and fine traces having widths of 3-50 μm and interval spaces of 3-50 μm can be achieved. The vias comprise superfilled copper and reduced graphene oxide (rGO) wherein the rGO is formed between inner walls and bottoms of the drilled holes and the superfilled copper. Each fine trace comprises a copper cladding layer formed on the nonconductive substrate, a thin flat copper layer formed on the copper cladding layer and PPR plated copper layer formed on the thin flat copper layer. The thin flat copper layer has a thickness of 1-20 μm at a variation of less than 10%. The PPR plated copper layer has a thickness of 5-50 μm at a variation of less than 15%.

The drilled holes preferably have an interval space of 0.1-1 mm. Each of the holes has a diameter of 10-200 μm and a depth of 10-200 μm. The fine traces preferably have widths of 3-30 μm and interval spaces of 3-30 μm.

DETAILED DESCRIPTION OF THE PREFERRED EMBODIMENTS

Figure 1:
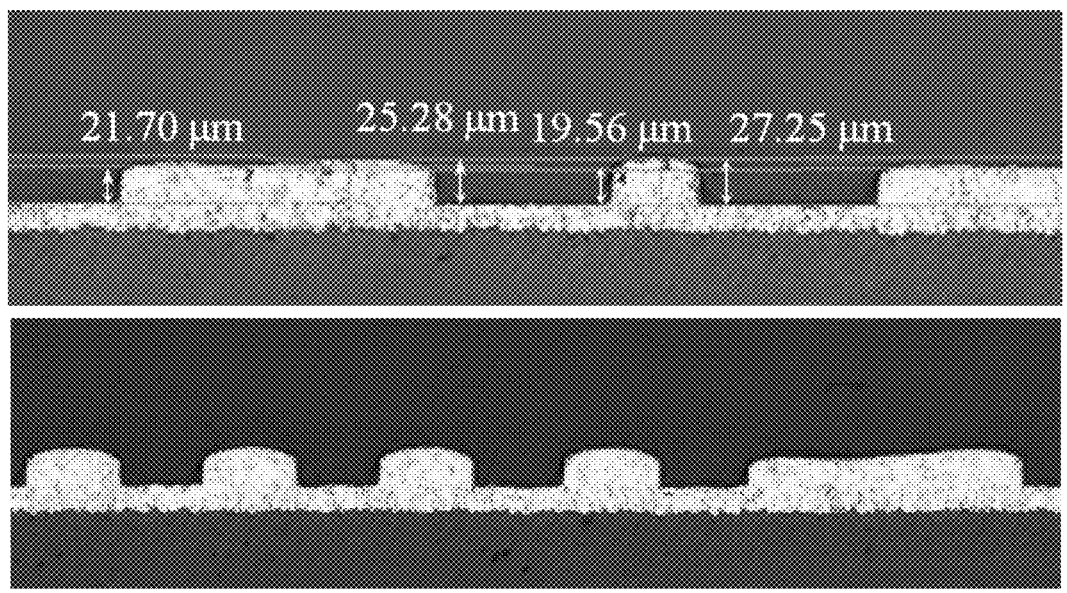
FIG. 1 shows the traces with width/space of 30/30 μm produced by the conventional MSAP and have uneven thicknesses and no square profiles.
Figure 2:
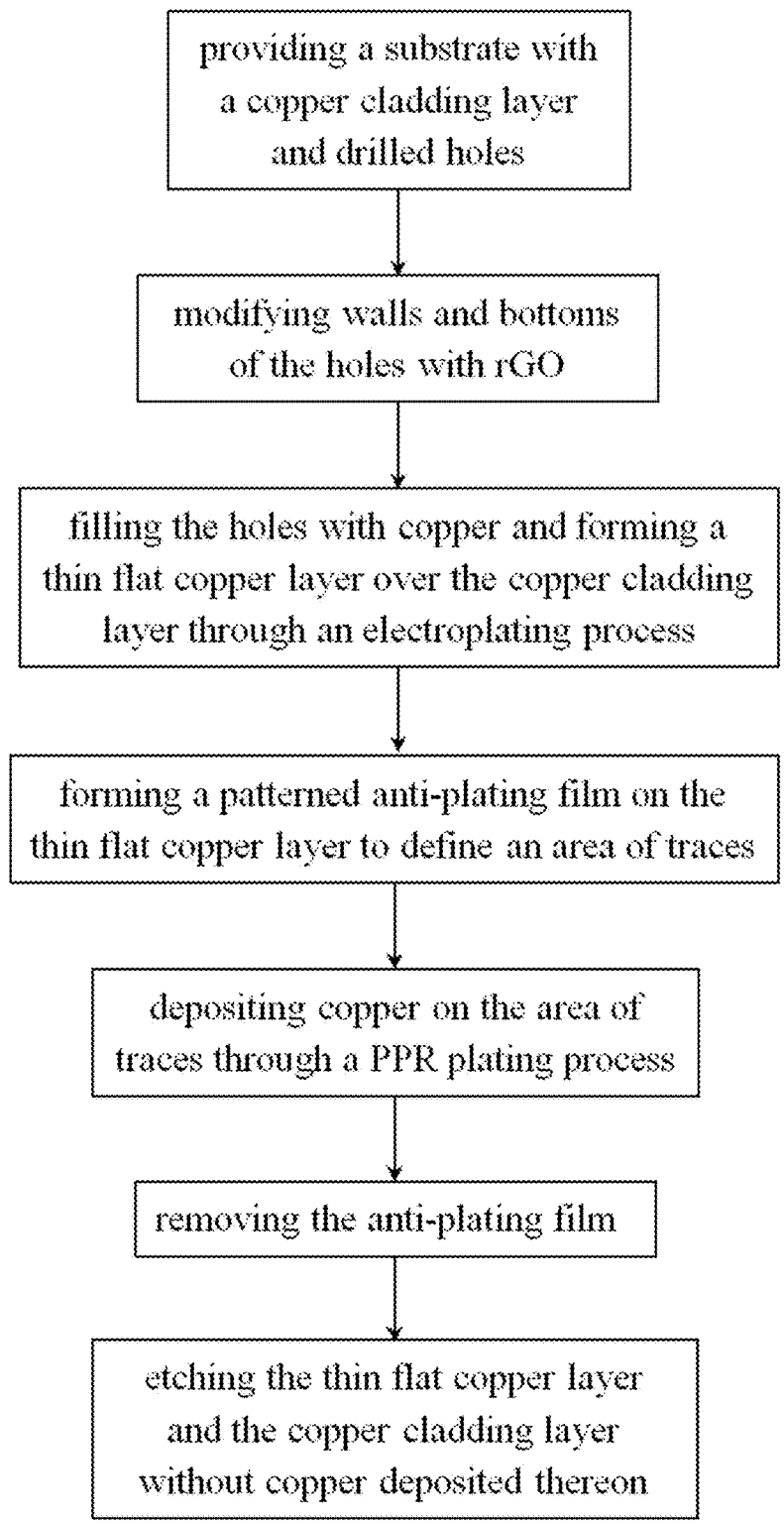
FIG. 2 shows the procedures of the method.

The method for manufacturing traces of a PCB according to the present invention will be described in detail by way of the example presented below in conjunction with the accompanying figures. FIG. 2 shows the procedures of the method.

Example 1

A. Modifying Walls and Bottoms of the Holes with rGO (Referring to the SLOTOGO™ Process)

A substrate with a copper cladding layer having a thickness of 3 μm is provided. On a top surface of the substrate, blind holes are formed by laser drilling. The blind holes have an interval space of 0.3 mm and each of the holes has a diameter of 75 μm and a depth of 50 μm. The substrate is first immersed in an aqueous solution of a conditioner (polyvinylimidazole, PVI) to form a PVI polymer layer on inner walls and bottoms of the holes. The condition solution has a concentration of 4-10 g/L at pH 3-6 and 60° C. After 10 minutes, the substrate is rinsed with water and then dried.

Next, the substrate is immersed in an aqueous solution of graphene oxide (GO) which is then absorbed and bound with the PVI layer within the holes. The GO solution has a concentration of 0.1-1 g/L at pH 3-6 and 60° C. After 10 minutes, the substrate is rinsed with water and then dried.

The substrate is then applied with the $H_2$ plasma reduction process for 10 minutes to reduce the GO within the holes to reduced graphene oxide (rGO).

B. Filling the Holes and Forming a Thin Flat Copper Layer

The substrate is cleaned with an acid cleaner (SLOTOCLEAN S 20 from SCHLOTTER™, 0.5-5%) at 15-30° C. for 3-10 minutes to eliminate the surface impurities. After it is rinsed with water, the substrate is immersed in a microetching solution (SLOTOETCH 584 from SCHLOTTER™, 10-40 g/L) at 15-30° C. for 3-10 minutes to form a coarse surface. The substrate is then rinsed with water.

The cleaned substrate is then immersed in a 2.5 liter electroplating bath available from SCHLOETTER™. The electroplating solution includes $CuSO_4$ (220 g/L), $H_2SO_4$ (40 g/L), chloride ions (60 ppm), a carrier (SLOTOCOUP 31 from SCHLOTTER™, 5 ml/L), a brightener (SLOTOCOUP 32 from SCHLOTTER™, 0.2 ml/L) and a leveler (SLOTOCOUP 33 from SCHLOTTER™, 0.18 ml/L). The plating process is performed with moderate agitation at a current density of 10 ASF (amps per square foot) for 50 minutes. The copper ions are bonded with rGO and reduced to copper metal to superfill the blind holes as blind vias and form a thin flat copper layer on the copper cladding layer. As shown in FIG. 2, the via 40 is formed by superfilling the drilled hole with copper. The layer 20 includes the thin flat copper layer and the copper cladding layer on the nonconductive substrate 30 and have a total thickness of only 6.20 μm.

C. Defining an Area of Traces with an Anti-Plating Film

The copper layer is pretreated with cleaning and micro etching. Then a plating resist ink layer is positioned on the thin flat copper layer. Through the exposure and developing processes, the plating resist ink layer is transformed to an anti-plating dry film to define an area of traces. The traces are designed with a width of 30 μm and an interval space of 30 μm.

D. Forming the Traces Through the PPR Plating Process

The traces are thickened through the periodic pulse reverse (PPR) vertical plating process. The electroplating solution includes $CuSO_4$ (80 g/L), $H_2SO_4$ (200 g/L), chloride ions (100 ppm), an additive (SLOTOCOUP CU211 from SCHLOTTER™, 10 ml/L; SLOTOCOUP CU212 from SCHLOTTER™, 0.15 ml/L). The plating process is operated at a forward current density of 2 ASD, a forward/reverse current density ratio of 1:2, a forward/reverse time ratio of 20:1 and normal agitation for 60 minutes.

E. Removing the Anti-Plating Film

The anti-plating film is stripped.

F. Etching the Unwanted Copper Layer

Then the thin flat copper layer and the copper cladding layer without traces deposed thereon are removed through the differential etching process to isolate the fine traces.

As a result, a printed circuit board (PCB) comprising a nonconductive PCB substrate with drilled holes, vias formed in the drilled holes and fine traces is achieved. The vias are composed of copper filling and reduced graphene oxide (rGO). The rGO is formed between the inner walls and bottoms of the holes and the superfilled copper. The fine traces have widths of 3-50 μm and interval spaces of 3-50 μm. Each fine trace is composed of a copper cladding layer, a thin flat copper layer and PPR plated copper layer. The copper cladding layer is formed on the nonconductive PCB substrate. The thin flat copper layer is formed on the copper cladding layer and has a thickness of 1-20 μm at a variation of less than 10%. The PPR plated copper layer is formed on the thin flat copper layer and has a thickness of 5-50 μm at a variation of less than 15%.

Figure 3:
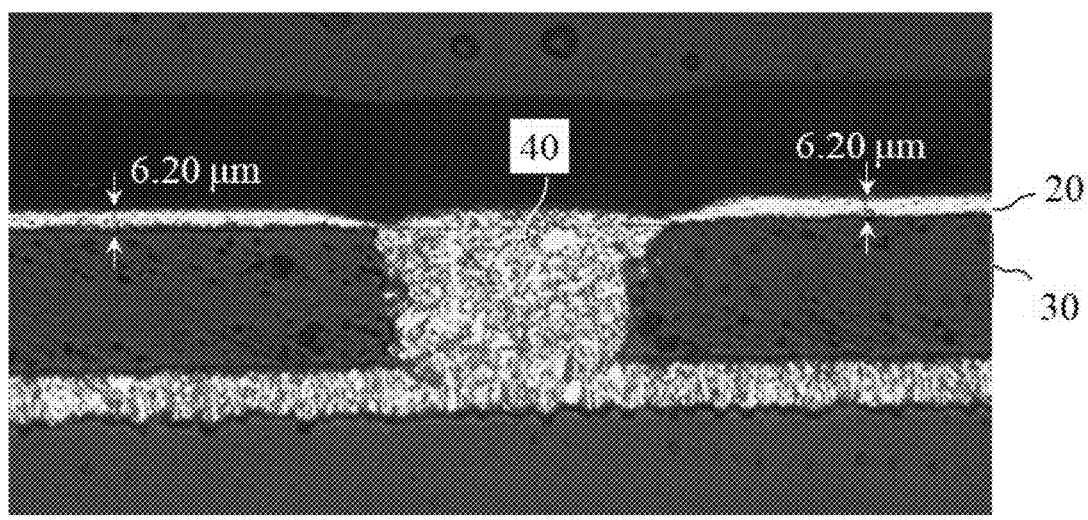
FIG. 3 shows the blind vias are superfilled and the thin flat copper layer is formed.
Figure 4:
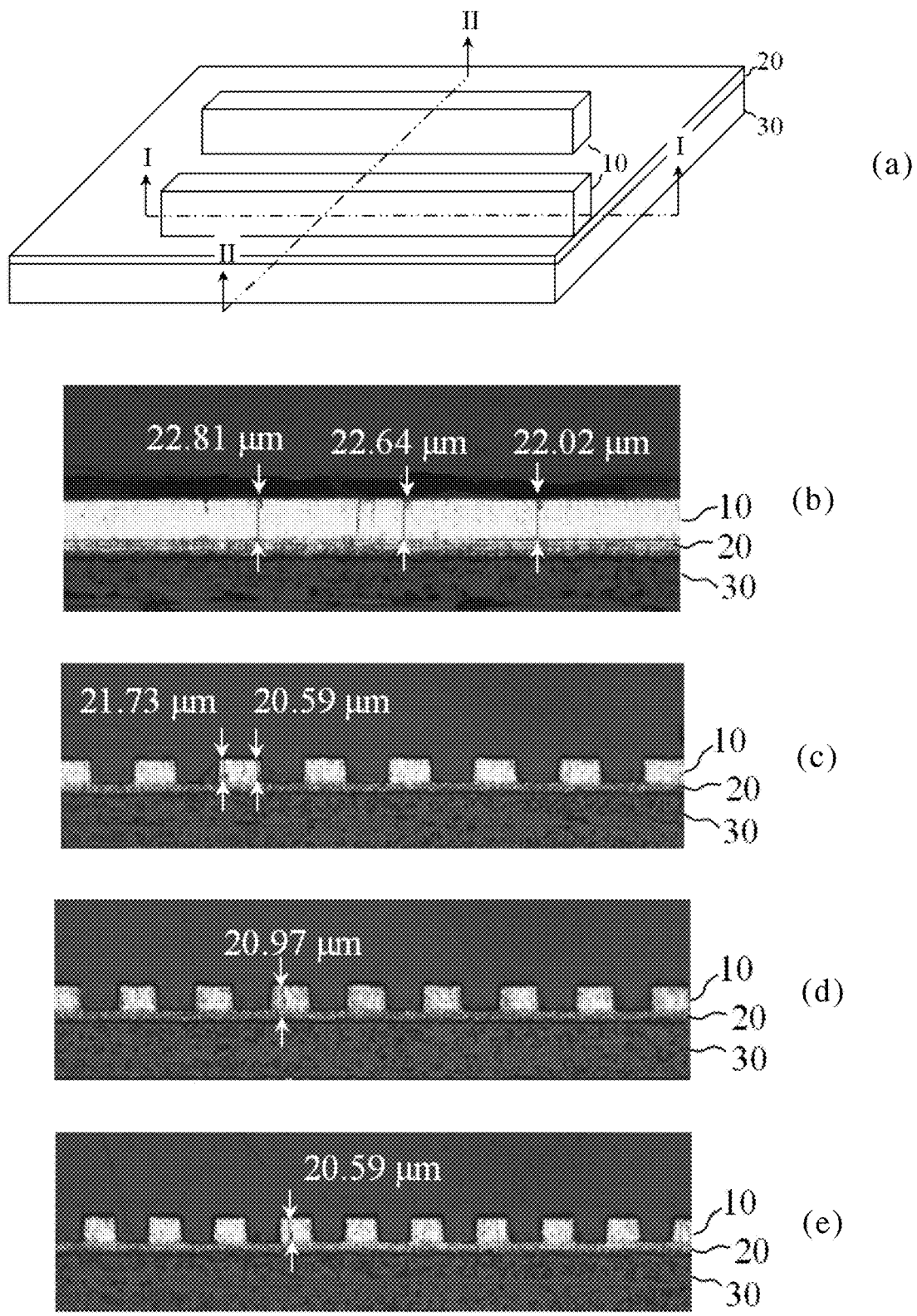
FIG. 4 shows the fine traces after the PPR plating have even thicknesses.

FIG. 3 shows cross sections of the fine traces after the PPR plating, wherein figure (a) illustrates the cutting lines (I-I) and (II-II) of the fine traces 10 formed on the copper layer 20 and the nonconductive substrate 30. The copper layer 20 includes the copper cladding layer and the thin copper layer. Figure (b) is the cross section along with the cutting line (I-I) and shows that the trace has thicknesses of 22.02-22.81 μm at a variation of 3.5%. Figures (c)-(e) are the cross sections along with the cutting line (II-II) and show that the traces have thicknesses of 20.59-21.73 μm at a variation of 5.2%.

In accordance with the result of the preferred embodiment, the present invention exhibits advantages as follows:
1. filling or superfilling the vias and panel plating with an even thickness can be achieved by applying rGO to the PCB plating process;
2. the thin flat copper player can be quickly removed without undercut; and
3. low width/space traces with an even thickness and square profiles are available through the PPR pattern plating.

What is claimed is:

1. A method for manufacturing traces of a PCB, comprising steps of:
    A. providing a substrate with a copper cladding layer and drilled holes and modifying walls and bottoms of the holes with reduced graphene oxide (rGO);
    B. filling the holes with copper and forming a thin flat copper layer over the copper cladding layer with a thickness of 1-20 μm at a variation of less than 10% through an electroplating process;
    C. forming a patterned anti-plating film on the thin flat copper layer to define an area of traces having widths of 3-50 μm and interval spaces of 3-50 μm;
    D. depositing copper on the area of traces with thicknesses of 5-50 μm at a variation of less than 15% through a periodic pulse reverse (PPR) plating process operated at a forward current density of 0.5-5 ASD, a forward/reverse current density ratio of 1:1-1:10 and a forward/reverse time ratio of 2:1-50:1;
    E. removing the anti-plating film; and
    F. etching the thin flat copper layer and the copper cladding layer without copper deposited thereon.

2. The method of claim 1, wherein the walls and bottoms of the holes are modified by forming a polymer layer on inner walls and bottoms of the holes, absorbing and bonding graphene oxide (GO) with the polymer layer, and reducing the GO to reduced graphene oxide (rGO).

3. The method of claim 1, wherein the PPR plating process is operated at a forward/reverse current density ratio of 1:1-1:5 and a forward/reverse time ratio of 10:1-25:1.

* * * * *